(12) United States Patent
Hoshi et al.

(10) Patent No.: US 11,139,848 B2
(45) Date of Patent: Oct. 5, 2021

(54) COMMUNICATION SYSTEM, TRANSMISSION DEVICE, RECEPTION DEVICE, AND COMMUNICATION METHOD

(71) Applicant: Panasonic Semiconductor Solutions Co., Ltd., Kyoto (JP)

(72) Inventors: Kenichi Hoshi, Kyoto (JP); Ryoichi Suzuki, Osaka (JP); Akifumi Nagao, Osaka (JP); Kentaro Watanabe, Hyogo (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 15/931,981

(22) Filed: May 14, 2020

(65) Prior Publication Data

US 2020/0274569 A1 Aug. 27, 2020

Related U.S. Application Data

(63) Continuation of application No. PCT/JP2018/040486, filed on Oct. 31, 2018.
(Continued)

(51) Int. Cl.
*H04B 1/16* (2006.01)
*H04L 12/12* (2006.01)
(Continued)

(52) U.S. Cl.
CPC ............... *H04B 1/16* (2013.01); *H03F 3/24* (2013.01); *H04B 1/0475* (2013.01);
(Continued)

(58) Field of Classification Search
CPC .. H04L 27/34; H04B 1/0475; H04W 52/0229; H04W 52/0245; H04W 52/0238; H04W 52/02
See application file for complete search history.

(56) References Cited

U.S. PATENT DOCUMENTS 8,301,103 B2 10/2012 Huang et al.
2010/0150042 A1* 6/2010 Oh .................. H04W 52/0235
370/311
(Continued)

FOREIGN PATENT DOCUMENTS

EP 0 317 007 5/1989
JP 2008-28448 2/2008
(Continued)

OTHER PUBLICATIONS

Park et al., LP-WUR (Low-Power Wake-Up Receiver) Follow-Up, IEEE 802.11-16/0341r0, Intel Corporation, Mar. 2016 (Year: 2016).*
(Continued)

*Primary Examiner* — Aristocratis Fotakis
(74) *Attorney, Agent, or Firm* — Wenderoth, Lind & Ponack, L.L.P.

(57) ABSTRACT

A communication system including a transmission device and a reception device which wirelessly communicate with each other. The transmission device includes a transmission circuit that performs: cyclical transmission of a wake-up signal including a specific pattern; and transmission of data. The reception device includes: a standby circuit that receives a signal, and outputs a detection signal indicating reception of the wake up signal when detecting that the specific pattern is cyclically included in the signal received; and a reception circuit that receives the data from the transmission device after the detection signal is output from the standby circuit.

15 Claims, 8 Drawing Sheets

Related U.S. Application Data (60) Provisional application No. 62/599,291, filed on Dec. 15, 2017.

(51) Int. Cl.
  *H04L 12/40* (2006.01)
  *H04L 1/00* (2006.01)
  *H04B 1/04* (2006.01)
  *H03F 3/24* (2006.01)

(52) U.S. Cl.
  CPC ......... *H04B 1/0483* (2013.01); *H04L 1/0026* (2013.01); *H04L 12/12* (2013.01); *H04L 12/40039* (2013.01)

(56) References Cited

U.S. PATENT DOCUMENTS

| | | | |
|---|---|---|---|
| 2012/0069893 | A1 | 3/2012 | Shirakata et al. |
| 2012/0327942 | A1 | 12/2012 | Terabe et al. |
| 2014/0043146 | A1 | 2/2014 | Makdissi et al. |
| 2015/0339257 | A1 | 11/2015 | Hug et al. |
| 2016/0337973 | A1* | 11/2016 | Park ................ H04L 27/2613 |
| 2017/0026208 | A1 | 1/2017 | Milosiu et al. |
| 2017/0111858 | A1* | 4/2017 | Azizi ................ H04L 27/261 |
| 2018/0007629 | A1* | 1/2018 | Dorrance ................ H04L 27/06 |
| 2018/0063788 | A1* | 3/2018 | Yang ................ H04W 52/0241 |
| 2018/0152333 | A1* | 5/2018 | Shellhammer .... H04W 52/0229 |
| 2018/0192373 | A1* | 7/2018 | Fang ................ H04W 52/0235 |
| 2018/0376419 | A1* | 12/2018 | Li ................ H04W 52/0229 |
| 2019/0090189 | A1* | 3/2019 | Story ................ H04W 76/28 |
| 2020/0037251 | A1* | 1/2020 | Du ................ H04W 52/02 |
| 2020/0106651 | A1* | 4/2020 | Park ................ H04L 27/02 |
| 2020/0267651 | A1* | 8/2020 | Wilhelmsson .... H04W 52/0229 |
| 2020/0328863 | A1* | 10/2020 | Jia ................ H04W 52/0225 |

FOREIGN PATENT DOCUMENTS

| | | |
|---|---|---|
| JP | 2013-6557 | 1/2013 |
| JP | 2017-63405 | 3/2017 |
| WO | 2011/121690 | 10/2011 |
| WO | 2016/063741 | 4/2016 |

OTHER PUBLICATIONS

International Search Report dated Dec. 11, 2018 in International (PCT) Application No. PCT/JP2018/040486.

Extended European Search Report dated Dec. 7, 2020 in European Application No. 18887496.0.

* cited by examiner

COMMUNICATION SYSTEM, TRANSMISSION DEVICE, RECEPTION DEVICE, AND COMMUNICATION METHOD

CROSS REFERENCE TO RELATED APPLICATIONS

This application is a U.S. continuation application of PCT International Patent Application Number PCT/JP2018/040486 filed on Oct. 31, 2018, claiming the benefit of priority of U.S. Provisional Patent Application No. 62/599,291 filed on Dec. 15, 2017, the entire contents of which are hereby incorporated by reference.

BACKGROUND

1. Technical Field

The present invention relates to a communication system, a transmission device, a reception device, and a communication method, and in particular, to devices and a method for performing standby reception with low power consumption and good accuracy even in a field environment, with noise, in a communication system including a transmission device and a reception device which wirelessly communicate with each other.

2. Description of the Related Art

Recently, wireless communication devices included in a mobile system have been expected to achieve low power consumption, and further low power consumption has been demanded, in particular, of wireless communication devices driven by batteries. A wireless communication device requires always-on operation of a reception circuit due to uncertainty of transmission timings, and most of the power consumed by the wireless communication device is thus attributable to the always-on operation of the reception circuit.

Hence, a conventionally proposed method is to operate a dedicated standby circuit and operate a reception circuit only at the time of signal detection instead of operating the reception circuit at all times (see reference to International Publication No. WO2016/063741 (Patent Literature (PTL) 1 and U.S. Pat. No. 8,301,103, the Specification (PTL) 2). Since such a method avoids operating a reception circuit at all times, low power consumption of a wireless communication device is achieved.

SUMMARY

The problem, however, with a conventional standby circuit as such that is disclosed in PTL 1 or PTL 2 is that standby detection cannot be performed with good accuracy in a field environment with noise. For, the conventional standby circuit assumes the detection of a wake-up signal whose level is sufficiently higher than a noise level, and yet in recent years, with low power consumption in communications systems, the level itself of a wake-up signal has become lower and it is not always possible to ensure the level of a wake-up signal to be sufficiently higher than the noise level.

In view of this, the present invention is conceived to overcome such a problem and has an object to provide a communication system, a transmission device, a reception device, and a communication method that enable standby reception with low power consumption and good accuracy even in a field environment with noise.

In order to achieve the above object, a communication system according to one aspect of the present invention is a communication system including a transmission device and a reception device which wirelessly communicate with each other. The transmission device includes a transmission circuit that performs (i) cyclical transmission of a wake-up signal including a specific pattern and (ii) transmission of data. The reception device includes', a standby circuit that receives a signal, and outputs a detection signal indicating reception of the wake-up signal when detecting that the specific pattern is cyclically in in the signal received; and a reception circuit that receives the data from the transmission device after the detection signal is output from the standby circuit.

In order to achieve the above object, a communication system according to another aspect of the present invention is a communication system including a transmission device and a reception device which wirelessly communicate with each other. The transmission device includes a transmission circuit that performs (i) transmission of a wake-up signal including a specific pattern and (ii) transmission of data. The reception device includes: a standby circuit that receives a signal, and outputs a detection signal indicating reception of the wake-up signal when detecting that the specific pattern is included in the signal received; and a reception circuit that receives the data from the transmission device after the detection signal is output from the standby circuit. The specific pattern is a long pulse having radio field intensity that is continuously higher than a first threshold during a time period that is longer than a maximum frame period in data transmission specified in a communication standard. When receiving the long pulse having radio field intensity that is continuously higher than a second threshold during the time period, the standby circuit outputs the detection signal.

In order to achieve the above object, a transmission device according to one aspect of the present invention is a transmission device included in the above-described communication system.

In order to achieve the above object, a reception device according to one aspect of the present invention is a reception device included in the above-described communication system.

In order to achieve the above object, a communication method according to one aspect of the present invention is a communication method for use in a system including a transmission device and a reception device which wirelessly communicate with each other. The communication method includes: performing, by the transmission device, (i) cyclical transmission of a wake-up, signal including a specific pattern and (ii) transmission of data; by the reception device, receiving a signal, and outputting a detection signal indicating reception of the wake-up signal when detecting that the specific pattern is cyclically included in the signal received; and receiving, by the reception device, the data from the transmission device after the detection signal is output in the receiving of the signal and the outputting of the detection signal.

In order to achieve the above object, a communication method according to another aspect of the present invention is a communication method for use in a system, including a transmission device and a reception device which wirelessly communicate with each other. The communication method includes: performing, by the transmission device, (i) transmission of a wake-up signal including a specific pattern and (ii) transmission of data; by the reception device, receiving a signal, and outputting a detection signal indicating reception of the wake-up signal when detecting that the specific pattern is included in the signal received; and receiving, by the reception device, the data from the transmission device after the detection signal is output in the receiving of the signal and the outputting of the detection signal. The specific pattern is a long pulse having radio field intensity that is continuously higher than a first threshold during a time period that is longer than a maximum frame period in data transmission specified in a communication standard. In the receiving of the signal and the outputting of the detection signal, the detection signal is output when the long pulse is received, the long pulse having radio field intensity that is continuously higher than a second threshold during the time period.

The present invention provides a communication system, a transmission device, a reception device, and a communication method that enable standby reception with low power consumption and good accuracy even in a field environment with noise.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

The following describes in detail an embodiment of the present invention with reference to the drawings. Note that the embodiment described below shows a specific example of the present disclosure. The numerical values, circuits, elements, the arrangement and connection of the elements, steps, order of the steps, etc. indicated in the following embodiment are mere examples, and therefore do not intend to limit the scope of the present disclosure. Among elements in the following embodiment, those not recited in any one of the broadest, independent claims are described as optional elements. The drawings are presented schematically and are not necessarily precise illustrations. In addition, like reference signs indicate like elements in the drawings, and overlapping descriptions are omitted or simplified.

Figure 1:
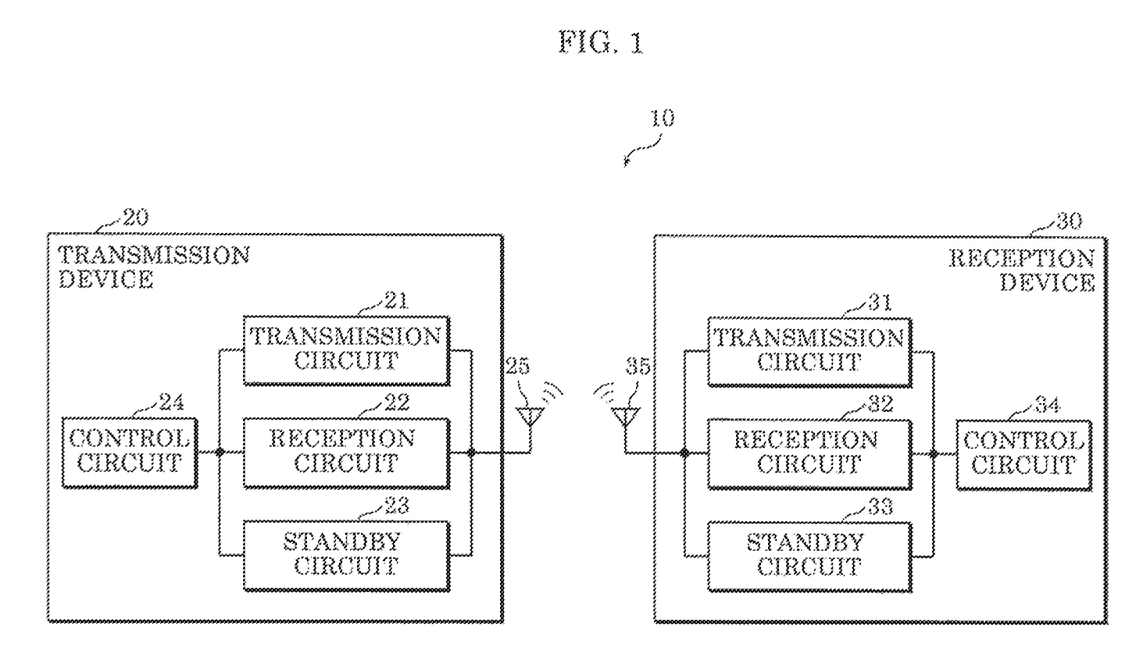
FIG. 1 is a block diagram illustrating a configuration of a communication system according to an embodiment.

FIG. 1 is a block diagram illustrating a configuration of communication system 10 according to an embodiment. Communication system 10 is one example of a communication system that enables standby reception with low power consumption and good accuracy even in a field environment with noise, and includes transmission device 20 and reception device 30 which wirelessly communicate with each other.

Transmission device 20 is one example of a wireless communication device that transmits data. In this embodiment, transmission device 20 has a function to transmit or receive data and includes transmission circuit 21, reception circuit 22, standby circuit 23, control circuit 24, and antenna 25.

Antenna 25 is an antenna that transmits or receives radio signals, and is a vertical antenna, for example.

Figure 2A:
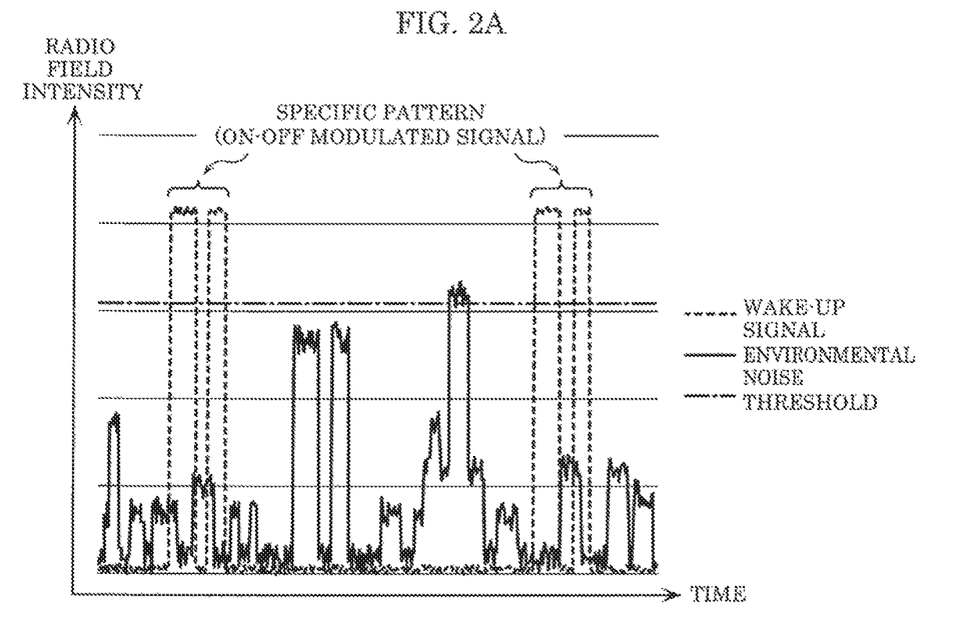
FIG. 2A is a timing chart illustrating an example of a specific pattern (an on-off modulated signal) included in a wake-up signal according to the embodiment.
Figure 2B:
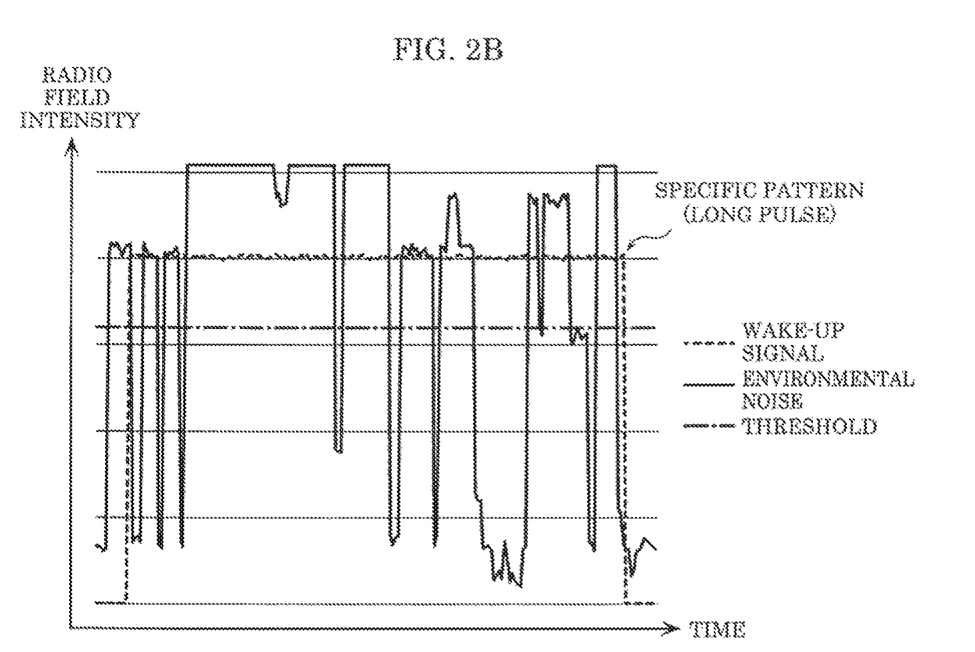
FIG. 2B is a timing chart illustrating another example of a specific pattern (a long pulse) included in the wake-up signal according to the embodiment.

Transmission circuit 21 is a circuit that performs, via antenna 25: cyclical transmission of a wake-up signal including a specific pattern; and transmission, of data, and includes, for example, a modulation circuit, an amplifier circuit, a band-pass filter, etc. The specific pattern is a predetermined signal pattern included in a wake-up signal and is, for example, an on-off modulated signal (in a dotted line), as illustrated in FIG. 2A, which is subjected to an modulation (on-off keying) to rise across a predetermined threshold of radio field intensity. Alternatively, the specific pattern is a long pulse in a dotted line), as illustrated in FIG. 2B, which has radio field intensity that is continuously higher than a predetermined threshold first threshold) during a time period that is longer than the maximum frame period in data transmission specified in a communication standard adopted by communication system 10. FIG. 2A and FIG. 2B each illustrate also an example of environmental noise (in a solid line) and a threshold (in a dashed-dotted line) for reference. The specific pattern may include a modulated signal which is obtained by modulating arbitrary data which does not depend on the waveform of the specific pattern itself.

Standby circuit 23 receives a signal via antenna 25, and outputs a detection signal (hereinafter referred to as "wake-up detection signal") indicating the reception of a wake-up signal when detecting that a specific pattern is cyclically included in the signal received (i.e., detecting cyclicity). Specifically, standby circuit 23 repeats, with regularity, a process of determining, within a predetermined period (also referred to as "wake-up enable period"), whether a specific pattern is included in the signal received, and when determining, at least a predetermined number of times, that a specific pattern is included in the signal received, standby circuit 23 outputs a wake-up detection signal.

The regularity here means predetermined timings, and includes the meaning not only of fixed time intervals but also of changing a time interval in a predetermined order. In this embodiment, regularity is defined as fixed time intervals. In this case, each of the fixed time intervals is n times as long as a cycle in which transmission device 21, cyclically transmits a specific pattern, where n is an integer of 2 or greater. Specifically, in the case where the above-mentioned predetermined period is divided into a plurality of time slots (e.g., 100 μs) to detect the cyclicity of a specific pattern, standby circuit 23 outputs a wake-up detection signal when determining, at least the predetermined number of times in one of the plurality of time slots, that a specific pattern is included in the received signal.

Reception circuit 22 is a circuit that receives, via antenna 25, data transmitted from transmission device 20 after the wake-up detection signal is output from standby circuit 23, and includes, for example, a band-pass filter, an amplifier circuit, a demodulation circuit, etc. For the low power consumption of transmission device 20, reception circuit 22 is normally in an off-state (i.e., in a low consumption standby mode) so as not to receive power supply from a power circuit (not shown in the diagram). After the wake-up detection signal is output from standby circuit 23, reception circuit 22 operates (i.e., in a data reception mode) upon receiving the power supply, and then changes the mode back to the low consumption standby mode again when data is not received for a certain time.

Control circuit 24 is a circuit that controls transmission circuit 21, reception circuit 22, and standby circuit 23, and includes, for example, ROM in which a program is stored, RAM, a processor that executes the program, and an input/output circuit. Control circuit 24 also receives an instruction from a user via an input device (not shown in the diagram) such as a touch panel, performs user interface processing of presenting information to the user via an output device (not shown in the diagram) such as a display, or performs control to shift an operation mode (low consumption standby mode or data reception mode).

Reception device 30 is one example of a wireless communication device that receives data. In this embodiment, reception device 30 has a function to transmit and receive data, and includes transmission circuit 31, reception circuit 32, standby circuit 33, control circuit 34, and antenna 35. Since transmission circuit 31, reception circuit 32, standby circuit 33, control circuit 34, and antenna 35 each have the same function as that of transmission circuit 21, reception circuit 22, standby circuit 23, control circuit 24, and antenna 25, respectively, the detailed description is omitted.

Figure 3A:
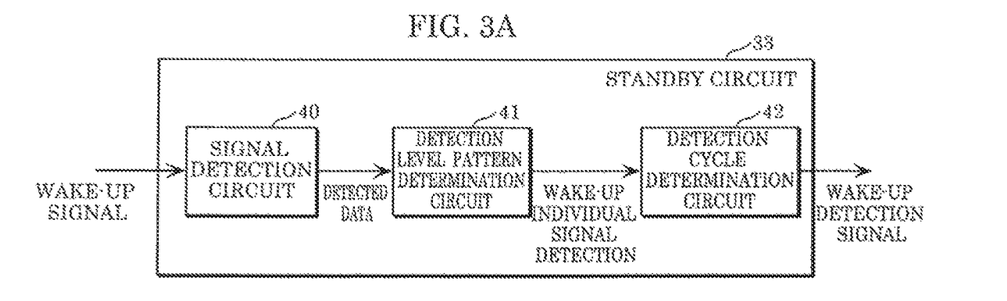
FIG. 3A is a block diagram illustrating a detailed configuration of a standby circuit included in a reception device illustrated in FIG. 1.

FIG. 3A is a block diagram illustrating a detailed configuration of standby circuit 33 included in reception device 30 illustrated in FIG. 1. Note that standby circuit 23 included in transmission device 20 has the same configuration as that of standby circuit 33 included in reception device 30.

Standby circuit 33 includes signal detection circuit 40, detection level pattern determination circuit 41, and detection cycle determination circuit 42.

Signal detection circuit 40 is a circuit that converts, into a digital signal, a base band signal which is obtained by detecting a signal (referred to as "wake-up signal") received via antenna 35, to output detected data.

Detection level pattern determination circuit 41 is a circuit that detects a specific pattern by detecting, in the detected data that has been output from signal detection circuit 40, a period during which a signal level is higher than a predetermined threshold and a period during which the signal level is lower than the predetermined threshold. When detecting a specific pattern, detection level pattern determination circuit 41 outputs a wake-up individual signal indicating the detection of the specific pattern.

Detection cycle determination circuit 42 is a circuit that detects regularity in the appearance of a specific pattern by determining that the wake-up individual signal which has been output from detection level pattern determination circuit 41 appears with regularity (cyclically, here). When detecting regularity in the appearance of the specific pattern, detection cycle determination circuit 42 outputs a wake-up detection signal indicating the detection of the regularity.

Figure 3B:
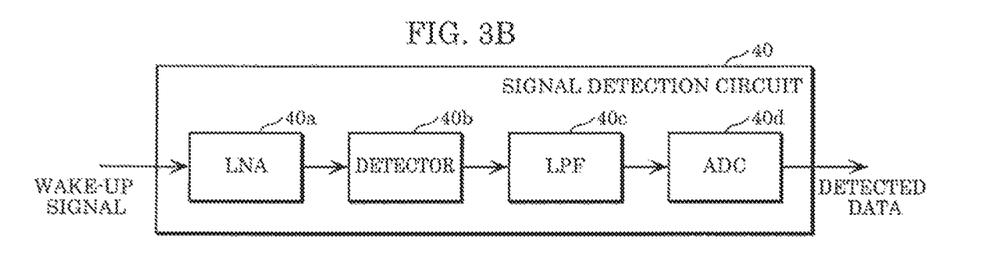
FIG. 3B is a circuit diagram illustrating an example of a detailed configuration of a signal detection circuit illustrated in FIG. 3A.

FIG. 3B is a circuit diagram illustrating an example of a detailed configuration of signal detection circuit 40 illustrated in FIG. 3A. Signal detection circuit 40 includes low-noise amplifier (LNA) 40a, detector 40b, low-pass filter (LPF) 40c, and A/D converter (ADC) 40d. The wake*up signal that is input to signal detection circuit 40 is demodulated by detector 40b after having been amplified by low-noise amplifier 40a. Subsequently, only low frequency components of the wake-up signal are extracted by low-pass filter 40c, and after that, the wake-up signal is converted from an analog signal to a digital signal so that the wake-up signal is output as detected data.

Figure 3C:
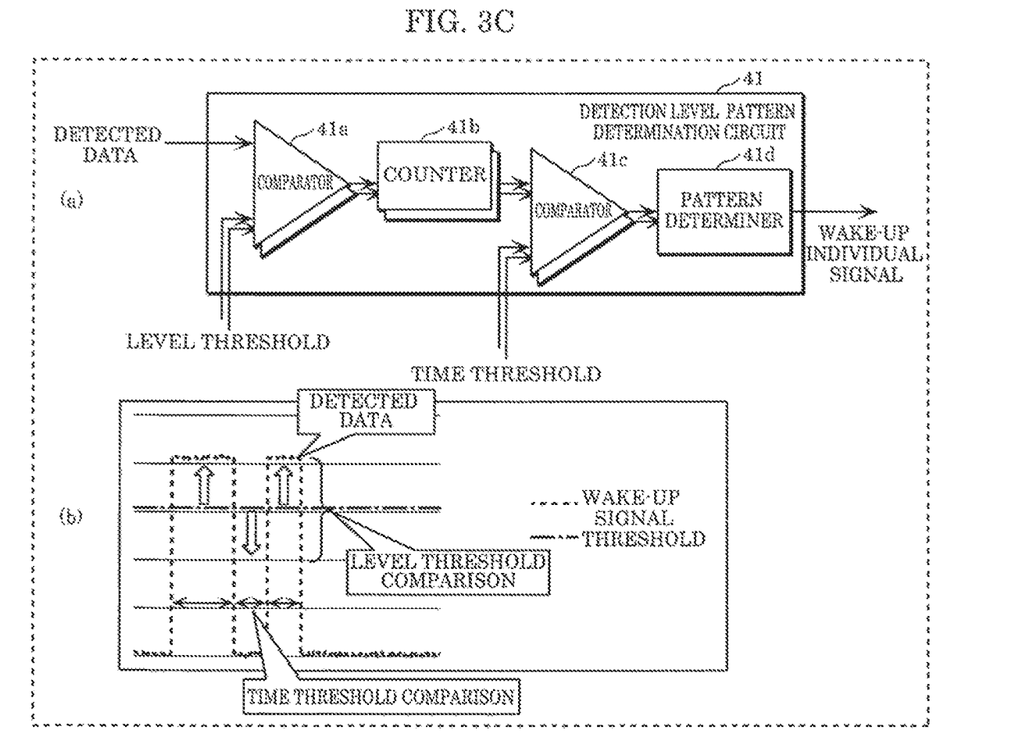
FIG. 3C is a diagram illustrating an example of a detailed configuration of a detection level pattern determination circuit illustrated in FIG. 3A, and its signal processing.

FIG. 3C is a diagram illustrating an example of a detailed configuration of detection level pattern determination circuit 41 illustrated in FIG. 3A ((a) in FIG. 3C), and its signal processing ((b) in FIG. 3C). (b) in FIG. 3C illustrates signal processing in the case where a specific pattern is an on-off modulated signal illustrated in FIG. 2A.

Detection level pattern determination circuit 41 includes comparator 41a, counter 41b, comparator 41c, and pattern determiner 41d, as illustrated in (a) in FIG. 3C. The detected data that has been input to detection level pattern determination circuit 41 is compared with a predetermined level threshold by comparator 41a (see reference to "level threshold comparison" in (b) in FIG. 3C), and subsequently, a time during which a signal level that is higher or lower than the level threshold is measured by counter 41b. The measured time is compared with a predetermined time threshold by comparator 41c (see reference to "time threshold comparison" in (b) in FIG. 3C). Pattern determiner 41d determines whether the comparison result obtained by comparator 41c corresponds to both on-state and off-state of the specific pattern. When determining that the comparison result corresponds to the both states, pattern determiner 41d outputs a wake-up individual signal indicating the detection of the specific pattern. It should be noted that when the specific pattern is a long pulse illustrated in FIG. 2B, pattern determiner 41d is unnecessary.

Figure 3D:
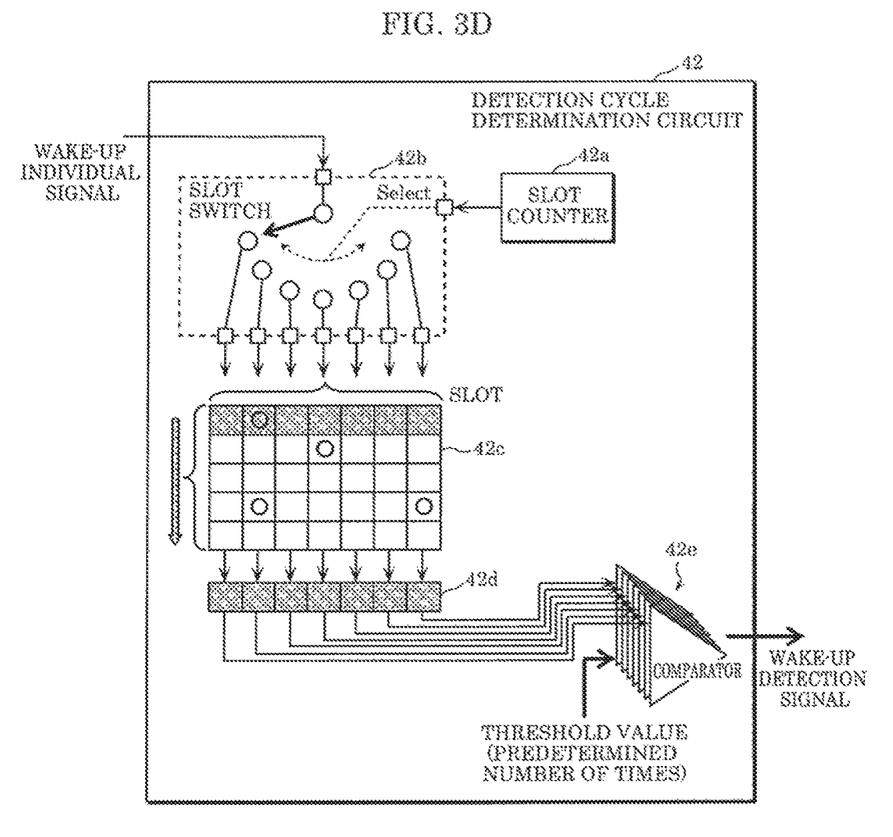
FIG. 3D is a circuit diagram illustrating an example of a detailed configuration of a detection cycle determination circuit illustrated in FIG. 3A.

FIG. 3D is a circuit diagram illustrating an example of a detailed configuration of detection cycle determination circuit 42 illustrated in FIG. 3A. In order to determine that a wake-up individual signal appears with regularity (cyclically, here), detection cycle determination circuit 42 divides a predetermined period ("wake-up enable period") into a plurality of time slots. When determining, at least a predetermined number of times in one of the plurality of time slots, that a wake up individual signal is received, detection cycle determination circuit 42 outputs a wake up detection signal indicating the reception of a wake-up signal. Detection cycle determination circuit 42 includes slot counter 42a, slot switch 42b, shift register 42c, adder 42d, and comparator 42e.

Slot counter 42a outputs, to slot switch 42b for each predetermined period ("wake-up enable period"), a switching signal indicating a timing of each of divided time slots (seven time slots, here). Every time the switching signal is received from slot counter 42a, skit switch 42b sequentially sorts an input signal (i.e., wake-up individual signal) into seven input ports of shift register 42c, to output the signal. Shift register 42c has multiple stages (five stages, here) each having seven input ports (i.e., shift register having seven rows and five stages), and shifts a held value each time slot counter 42a overflows. Adder 42d calculates a total value for each of the seven rows in shift register 42c. Comparator 42e compares each of the total values (i.e., seven total values) calculated for the seven rows by adder 42d with a threshold value (the aforementioned predetermined number of times), and outputs a wake-up detection signal when at least one total value indicates the threshold value or greater.

The following describes an operation of communication system 10 (i.e., a communication method) according to this embodiment, which is configured as described above.

Figure 4:
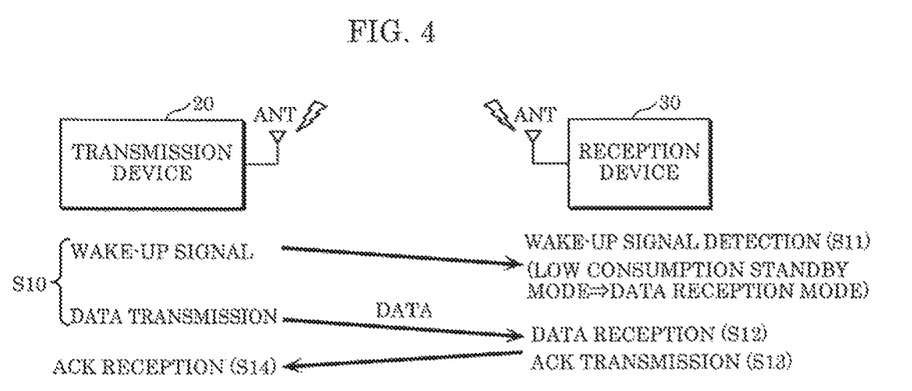
FIG. 4 is a communication sequence diagram illustrating an operation of the communication system according to the embodiment.
Figure 5:
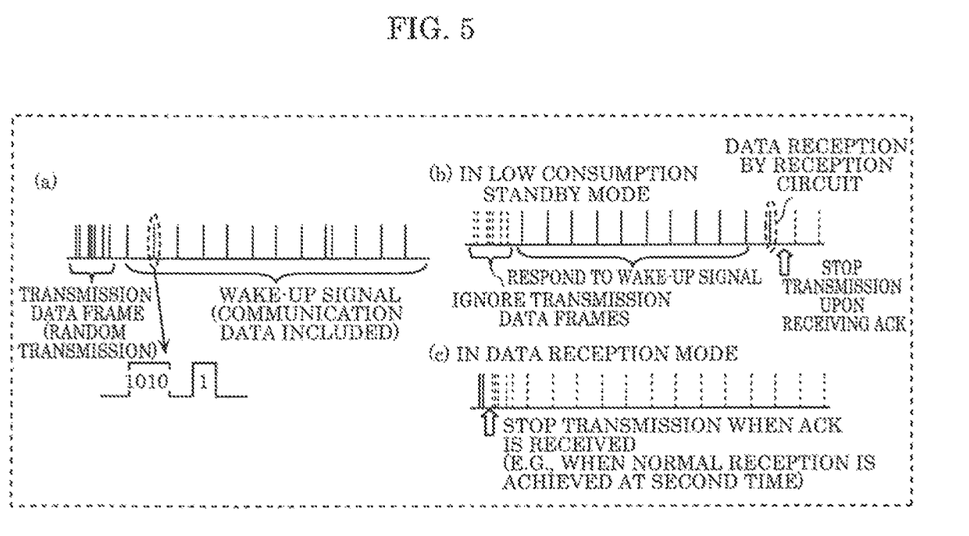
FIG. 5 illustrates timing charts each illustrating an example of a signal in transmission or reception performed in each step illustrated in FIG. 4.

FIG. 4 is a communication sequence diagram illustrating the operation of communication system 10 according to the embodiment. FIG. 5 is a timing chart illustrating an example of a signal in transmission or reception performed in each step illustrated in FIG. 4.

When transmitting data, transmission device 20 transmits a wake-up signal (i.e., a signal in which a specific pattern appears cyclically) and a data transmission frame (transmission step S10) since transmission circuit 21 does not know the mode of reception device 30 (whether the mode is a data reception mode), as illustrated in FIG. 4. The wake-up signal may be transmitted first and then the data transmission frame or vice versa, and at least one of the wake up signal and the data transmission frame may be repeatedly transmitted. Transmission step S10 is repeated any number of times until transmission device 20 receives an ACK signal from reception device 30 (S14). (a) in FIG. 5 illustrates an example of a signal in the transmission performed in transmission step S10 in FIG. 4. The example illustrates the case where a data transmission frame is transmitted at random and a wake-up signal (here, a cyclic repetition of a specific pattern that includes modulated communication data) is subsequently transmitted.

Figure 6:
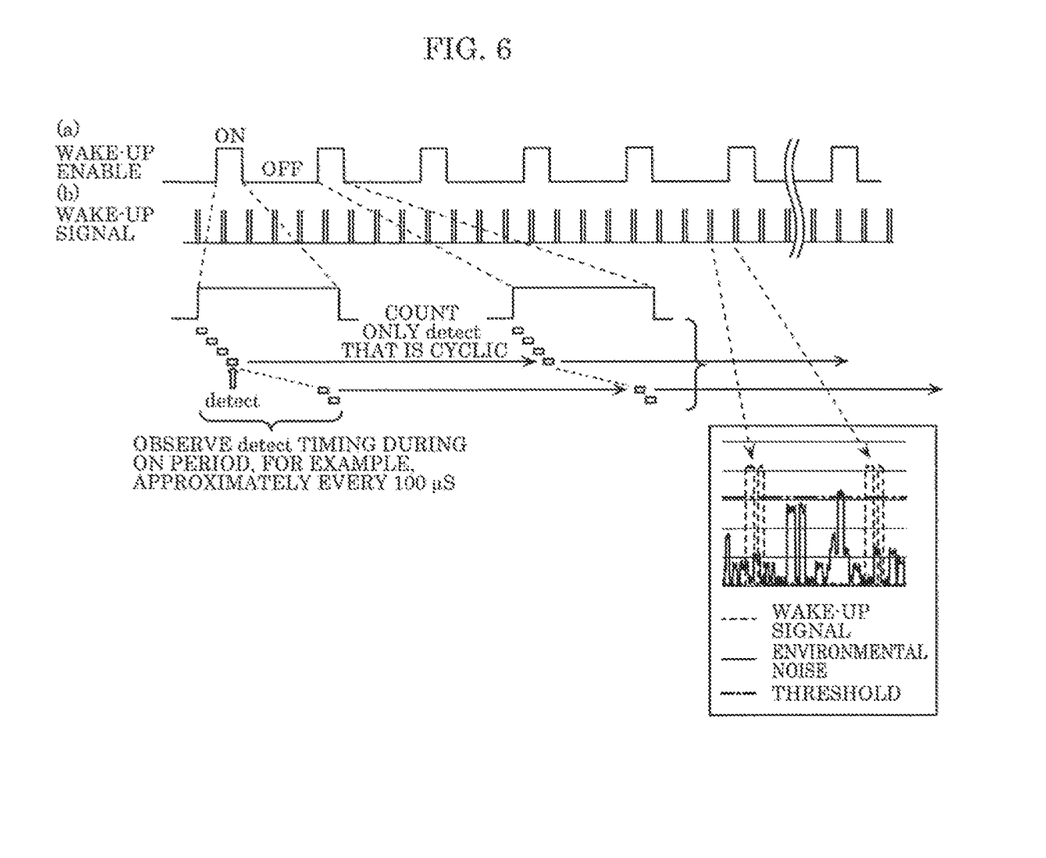
FIG. 6 illustrates timing charts each illustrating an example of an operation performed by a standby circuit in a reception device according to the embodiment.

In contrast, when reception device 30 is in a low consumption standby mode, standby circuit 33 receives a signal, and outputs a wake-up detection signal indicating the reception of the wake-up signal when detecting that a specific pattern is cyclically included in the received signal (i.e., detecting cyclicity) (standby step S11), as illustrated in FIG. 4. (b) in FIG. 6 illustrates an example of a signal in the reception performed in standby step S11 in FIG. 4. In the example, data transmission frames that are previously transmitted are ignored (see reference to data transmission frames indicated by broken lines in the diagram) since reception circuit 32 is in an off-state when reception device 30 is in the low consumption standby mode. Standby circuit 33 responds (i.e., outputs a wake-up detection signal) to the wake up signal that is subsequently transmitted. With this, reception device 30 switches from the low consumption standby mode to the data reception mode under the control by control circuit 34. In (b) in FIG. 5, an example of the case where transmission device 20 having received an ACK signal from transmission device 30 stops the transmission of the wake-up signal is also illustrated in the latter part of the signal example (see reference to wake-up signals indicated by broken lines in the diagram).

Subsequently, in reception device 30, reception circuit 32 receives a data transmission frame transmitted from transmission device 20 having received the wake-up detection signal from standby circuit 33 (reception step S12), as illustrated in FIG. 4. Transmission circuit 31 in reception device 30 then transmits an ACK signal in return to transmission device 20 to notify transmission device 20 that the data has been received (S13).

Having transmitted the wake-up signs and the data transmission frame, transmission device 20 shifts its mode to a data reception mode under the control by control circuit 24, and receives, by reception circuit 22, the ACK signal transmitted from transmission device 30 (S14), as illustrated in FIG. 4. Transmission device 20 having received the ACK signal stops transmission (i.e., transmission of a wake-up signal and a data transmission frame). (c) in FIG. 5 illustrates an example of a signal in the reception performed in step S14 in FIG. 4. The example illustrates the case where transmission device 20 stops transmission (transmission of a wake-up signal and a data transmission frame) when an ACK signal is received (e.g., when normal reception is achieved at the second transmission) (see reference to data transmission frames and wake-up signals, both of which are indicated by broken lines in the diagram).

FIG. 6 illustrates timing charts each illustrating an example of an operation performed by standby circuit 33 in reception device 30. (a) in FIG. 6 illustrates a timing example of a predetermined period (i.e., wake-up enable period ("ON" period in the diagram)) during which standby circuit 33 operates. (b) in FIG. 6 illustrates a timing example of a wake-up signal (i.e., repetition of a specific pattern) transmitted by transmission device 20.

A wake-up enable period during which standby circuit 33 operates is generated at fixed time intervals, as illustrated in the diagram. Each of the fixed time intervals is an integral multiple (4, here) of a cycle in which transmission device 20 cyclically transmits a wake-up signal including a specific pattern.

Standby circuit 33 determines, for each wake-up enable period that appears at fixed time intervals, whether a specific, pattern is detected ("detect" in the diagram) in each of the seven time slots into which the wake-up enable period is divided. When detecting, at least a predetermined number of times (e.g., two times) in the same time slot, that the specific pattern is detected, standby circuit 33 determines that a wake-up signal has been detected and outputs a wake-up detection signal.

As described above, communication system 10 according to this embodiment is a communication system that includes transmission device 20 and reception device 30 which wirelessly communicate with each other. Transmission device 20 includes transmission circuit 21 that performs: cyclical transmission of a wake-up signal including a specific pattern; and transmission of data. Reception device 30 includes: standby circuit 33 that receives a signal, and outputs a detection signal indicating reception of the wake-up signal when detecting that the specific pattern is cyclically included in the signal received; and reception circuit 32 that receives the data from transmission device 20 after the detection signal is output from standby circuit 33.

The communication method according to this embodiment is a communication method for use in communication system 10 including transmission device 20 and reception device 30 which wirelessly communicate with each other. The communication method includes: transmission step S10 of performing, by transmission device 20; cyclical transmission of a wake-up signal including a specific pattern; and transmission of data; standby step S11, which is performed by reception device 30, of receiving a signal, and outputting a detection signal indicating reception of the wake-up signal when detecting that the specific pattern is cyclically included in the signal received; and reception step S12 of receiving, by reception device 30, the data from the transmission device after the detection signal is output in standby step S11.

This achieves communication system 10 and the communication method that enable standby reception with low power consumption and good accuracy even in a field environment with noise since a wake-up signal detected by standby circuit 33 that operates independently from reception circuit 32 (i.e., operates with low power consumption) is not merely a signal whose level is higher than a noise level, but is a peculiar signal in which a specific pattern is cyclically repeated.

Standby circuit 33 repeats, with regularity, a process of determining, within a predetermined period (wake-up enable period), whether the specific pattern is included in the signal received, and outputs the detection signal when determining, at least a predetermined number of times, that the specific pattern is cyclically included in the signal received. With this, the cyclic inclusion of the specific pattern is detected, without fail, in the signal received and low power consumption is further achieved by the intermittent operation of standby circuit 33.

The regularity here means, for example, fixed time intervals. Specifically, each of the fixed time intervals is n times as long as a cycle in which transmission circuit 21 in transmission device 20 cyclically transmits the specific pattern, where n is an integer of 2 or greater. With this, a wake-up enable period appears in, a cycle longer than the cycle in which transmission cicuit 21 in transmission device 20 cyclically transmits a specific pattern, and standby circuit 33 performs an intermittent operation, and this further achieves low power consumption.

When the predetermined period (wake-up enable period) is divided into a plurality of time slots, standby circuit 33 outputs the detection signal (wake-up detection signal) when determining, at least the predetermined number of times in one of the plurality of time slots, that the specific pattern is included in the signal received. With this, not only the detection of the specific pattern during the wake-up enable period is used but also the sameness of a timing (i.e., phase) at which the specific pattern is detected during the wake-up enable period is taken into consideration, for the detection of a wake-up signal. Accordingly, standby reception is performed with high accuracy even in a field environment with noise.

One example of the specific pattern is an on-off modulated signal. Since the specific pattern is an on off modulated signal that is distinguishable from data, it is easy to detect a wake-up signal.

Transmission circuit 21 in transmission device 20 transmits data and subsequently transmits a wake-up signal. This enables reception device 30 to promptly perform data reception without waiting for the reception of a wake-up signal when reception device 30 is already in the data reception mode when transmission device 20 transmits data.

The following describes some advantages of the case where a specific pattern included in a wake up signal is a long pulse.

Figure 7A:
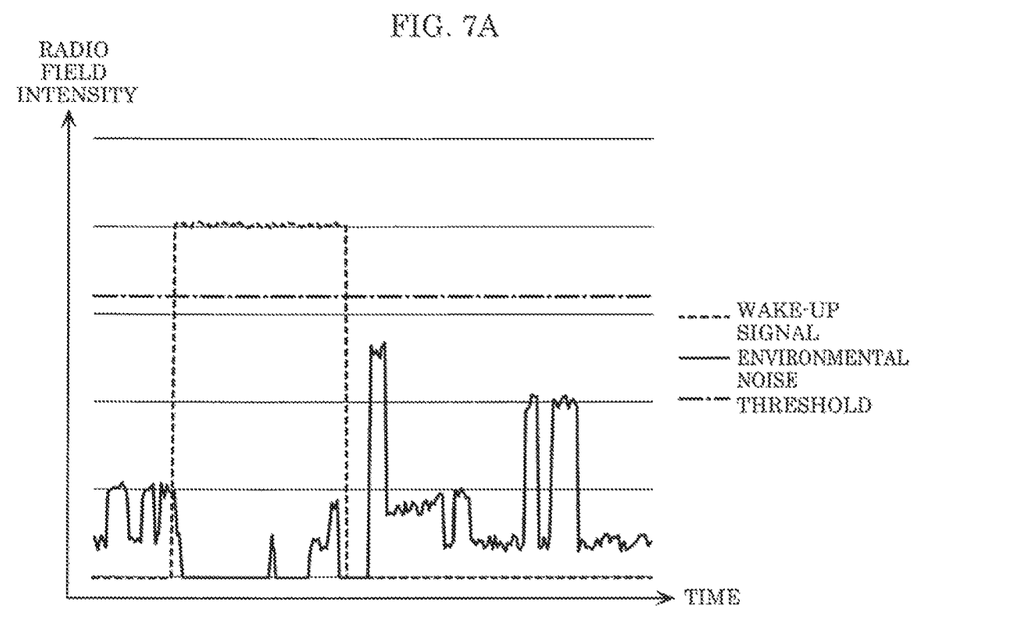
FIG. 7A is a timing chart illustrating an example of a waveform of a wake-up signal according to the prior art in an environment where the level of environmental noise is low.

FIG. 7A is a tuning chart illustrating an example of a waveform of a wake-up signal according to the prior art in an environment where the level of environmental noise is low. The vertical axis indicates radio field intensity and the horizontal axis indicates time. The solid line presents environmental noise, the dotted line presents the wake-up signal according to the prior art, and the dashed-dotted line presents a threshold used for the determination on the wake-up signal.

The wake up signal according to the prior art, which is illustrated in the diagram, is a pulse having radio field intensity that is continuously higher than a predetermined threshold during a time period that is shorter than the maximum frame period in data transmission specified in a communication standard. When the level of environmental noise is low, the wake-up signal according to the prior art can be detected by a reception device because the level of the wake up signal Is sufficiently higher than the level of environmental noise, as illustrated in the diagram.

Figure 7B:
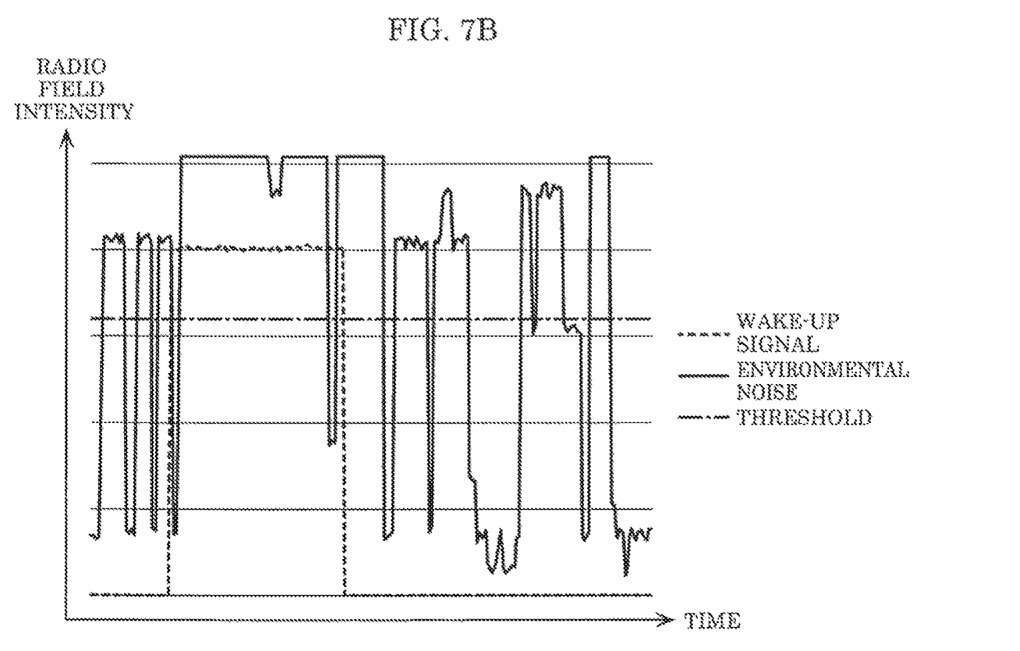
FIG. 7B is a timing chart illustrating an example of a waveform of the wake-up signal according to the prior art in an environment where the level of environmental noise is high.

When the level of environmental noise is high, however, it is difficult to detect the wake-up signal according to the prior art. FIG. 7B is a timing chart illustrating an example of a waveform of the wake-up signal according to the prior art in an environment where the level of environmental noise is high. When the level of environmental noise is high, the wake-up signal according to the prior art gets lost in the environmental noise, and it is thus difficult for the reception device to detect the wake-up signal, as illustrated in the diagram.

The case where the level of environmental noise is high means that the level of environmental noise is relatively higher compared to the radio field intensity of a wake-up signal. Particularly in recent years, a communication device tends to change its transmission output according to power consumption, and a noise level in an actual environment (i.e., environmental noise) is higher than the level of a signal processed in a system operating with low power consumption. Moreover, in the environment where other communication devices operate, the congestion of radio waves is significant and the wake-up signal according to the prior art is apt to get lost in the environmental noise.

In contrast, communication system 10 according to this embodiment adopts, as one example of a specific pattern included in a wake-up signal, a long pulse haring radio field intensity that is continuously higher than a predetermined threshold (i.e., first threshold) during a time period that is longer than the maximum frame period in data transmission specified in a communication standard. This enables the reception device to easily detect a wake-up signal even when the level of environmental noise is high.

Figure 8:
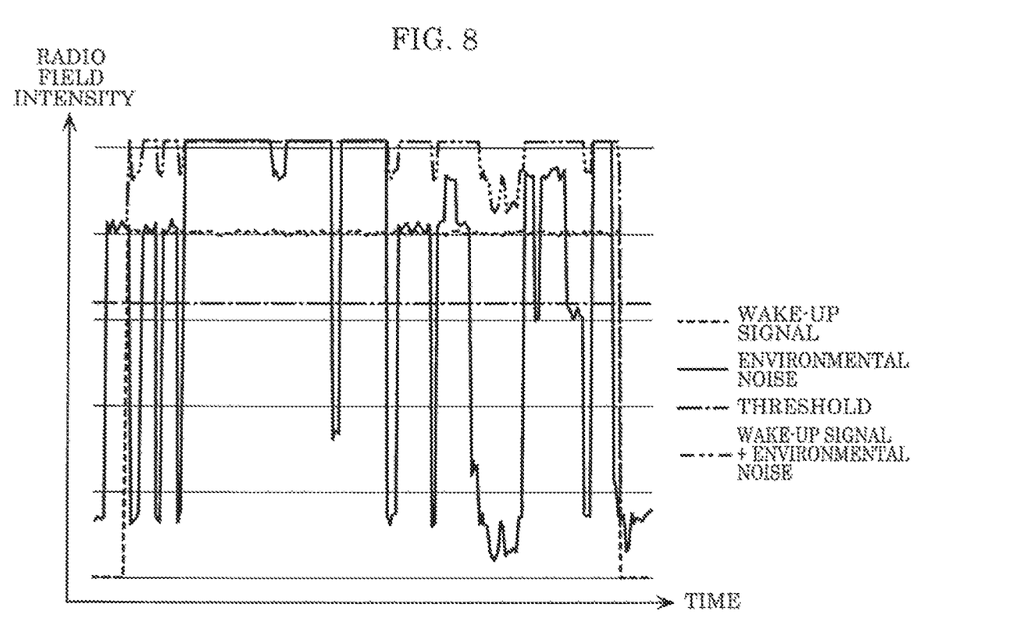
FIG. 8 is a timing chart illustrating an example of a waveform of the specific pattern (a long pulse) included in the wake-up signal according to the embodiment in an environment where the level of environmental noise is high.

FIG. 8 is a timing chart illustrating an example of a waveform of a specific pattern a long pulse) included in the wake-up signal according to this embodiment in an environment where the level of environmental noise is high. The diagram corresponds to the timing chart in FIG. 2B, but with an illustration added thereto of a waveform in which a specific pattern (i.e., a long pulse) overlaps environmental noise. High intensity noise in an actual environment field is usually communication signals to and from a communication device. In such a case, since communications stop within a certain time period (i.e., the maximum frame period), the noise level decreases accordingly in many cases. The long pulse according to this embodiment has radio field intensity that is continuously higher than a threshold (i.e., first threshold) during a certain time period (i.e., the maximum frame period), it becomes easy to detect a wake-up signal distinguishably from environmental noise. In other words, with the long pulse according to this embodiment, by transmitting a pulse having a time width longer than a time period during which the high intensity noise lasts, a valley signal level formed when the noise level decreases is raised so that a total signal level (i.e., the level of a signal in which the environmental noise overlaps the long pulse) does not fall (see reference to a broken line in the diagram). This enables easy detection of wake-up signal that is lost in environmental noise.

As described above, one example of a specific pattern included in the wake-up signal according to this embodiment is a long pulse having radio field intensity that is continuously higher than the first threshold during a time period that is longer than the maximum frame period in data transmission specified in a communication standard. Since a specific pattern is thus a signal distinguishable from data, it is possible to more surely detect a wake-up signal even in a field environment with noise.

Figure 9:
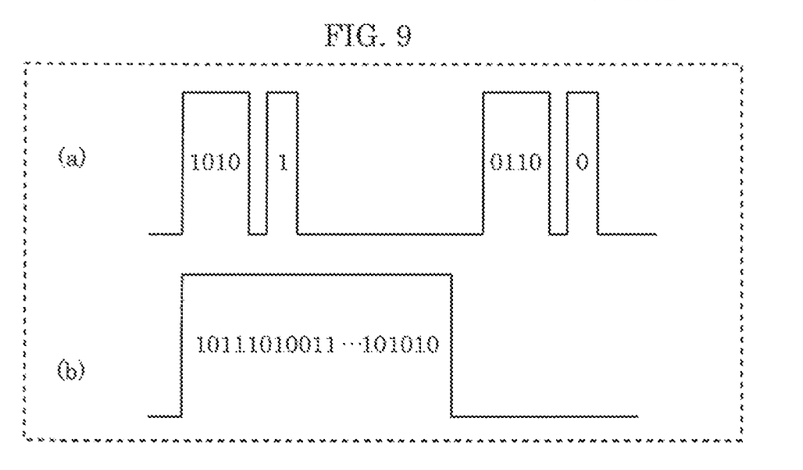
FIG. 9 illustrates timing charts each illustrating an example of the case where the specific pattern included in the wake-up signal according to the embodiment includes a modulated signal obtained by modulating arbitrary data.

As described above, a specific pattern included in the wake-up signal according to this embodiment may include a modulated signal obtained by modulating arbitrary data. FIG. 9 illustrates timing charts each illustrating an example of the case where a specific pattern included in a wake-up signal includes a modulated signal obtained by modulating arbitrary data. (a) in FIG. 9 is a timing chart indicating an example of the case where modulated data is included in a specific pattern subjected to on-off modulation. (b) in FIG. 9 is a timing chart illustrating an example of the case where modulated data is included in a specific pattern which is a long pulse.

A specific pattern included in the wake-up signal according to this embodiment may include a modulated signal obtained by modulating arbitrary data, as illustrated in the diagram. With this, a wake-up signal not only serves as a trigger causing reception device 30 to shift from a low consumption standby mode to a data reception mode, but also indicates transmission data. This shortens both a time required for transmission performed by transmission device 20 (i.e., transmission of a wake-up signal and a data transmission frame) and a time required for data reception performed by reception device 30.

In this embodiment, transmission device 20 cyclically transmits a specific pattern included in a wake-up signal, but does not need to do so when a long pulse is used as the specific pattern. In other words, the wake-up signal may be one long pulse. Even when a wake-up signal includes one long pulse, the wake-up signal is easily detectable even in a field environment with noise because a wake-up signal is a signal clearly distinguishable from data, as can be seen from what has been described above with reference to FIG. 7A, FIG. 7B, and FIG. 8.

A communication system according to a variation of this embodiment, which uses such a wake-up signal including one long pulse, can be realized by making some modifications (i.e., simplifications) to the communication system according to the aforementioned embodiment.

For example, transmission circuit 21 (transmission circuit 31) may transmit a long pulse only once instead of cyclically transmitting a long pulse included in a wake-up signal.

Figure 10A:
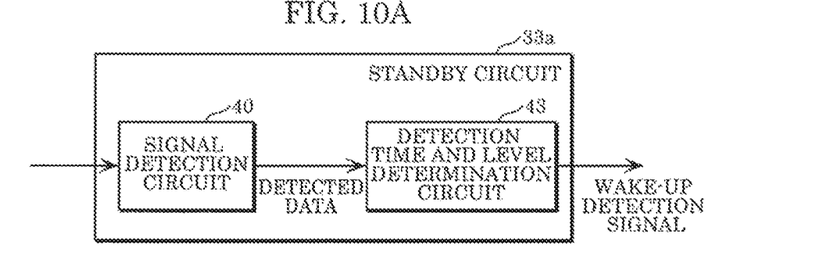
FIG. 10A is a block diagram illustrating a detailed configuration of a standby circuit according to a variation of the embodiment.
Figure 10B:
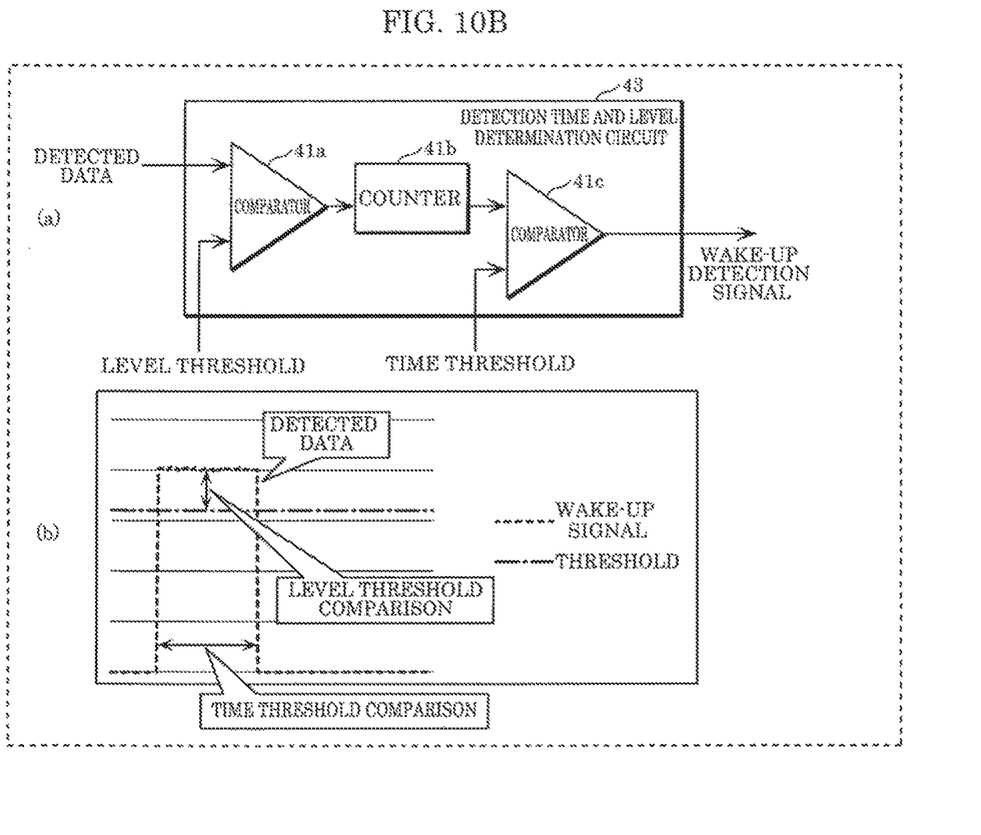
FIG. 10B is a diagram illustrating an example of a detailed configuration of a detection time and level determination circuit included in the standby circuit according to the variation of the embodiment, and its signal processing.

Standby circuit 33 (standby circuit 23) is required to receive a signal and detect that the received signal includes a long pulse instead of detecting that a specific pattern is cyclically included in the received signal (i.e., detection of cyclicity becomes unnecessary). More specifically, standby circuit 33a according to this variation includes signal detection circuit 40 and detection time and level determination circuit 43, as illustrated in the block diagram in FIG. 10A. Signal detection circuit 40 has the same configuration as that illustrated in FIG. 3B. Detection time and level determination circuit 43 has the configuration as illustrated in (a) in FIG. 10B illustrating the detail configuration thereof. The configuration illustrated in (a) in FIG. 10B is equivalent to a configuration obtained by excluding pattern determiner 41d from the configuration illustrated in (a) in FIG. 3C. (b) in FIG. 10B is a diagram illustrating signal processing performed by comparators 41a and 41c illustrated in (a) in FIG. 10B.

A communication method implemented by the communication system according to this variation is basically the same as the communication method according to the aforementioned embodiment, which is illustrated in FIG. 4, except that a wake-up signal includes one long pulse. In the communication method implemented by the communication system according to this variation, however, an example of a signal in transmission or reception performed in each step illustrated in FIG. 4 is different from that described in the aforementioned embodiment. The following describes signal examples with reference to FIG. 11.

Figure 11:
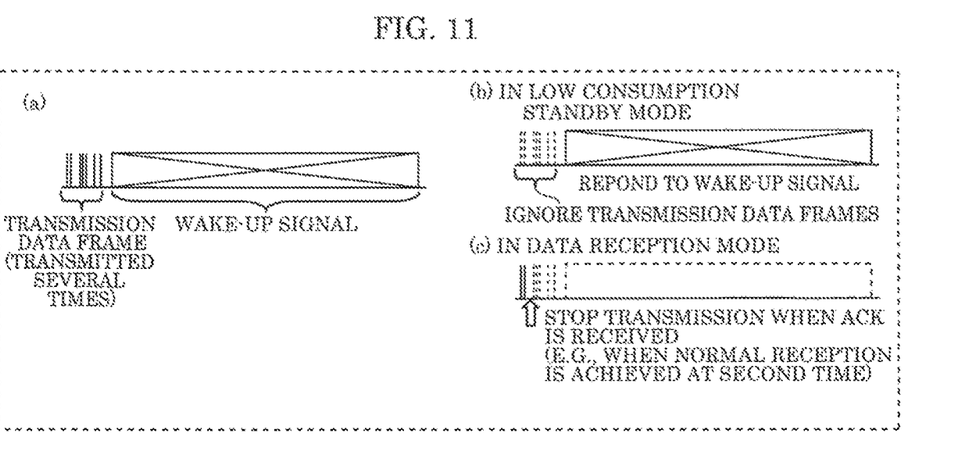
FIG. 11 illustrates timing charts each illustrating an example of a signal in transmission or reception performed in a communication method implemented by a communication system according to the variation of the embodiment.

FIG. 11 illustrates timing charts each illustrating an example of a signal in transmission or reception performed in the communication method implemented by the communication system according to this variation. (a) in FIG. 11 illustrates an example of a signal in the transmission performed in transmission step S10 in FIG. 4. The example illustrates the case where a data transmission frame is transmitted several times, and a wake-up signal (one long pulse, here) is subsequently transmitted.

(b) in FIG. 11 illustrates an example of a signal in the reception performed in standby step S11 in FIG. 4. In the example, previously transmitted transmission frames are ignored (see reference to data transmission frames indicated by broken lines in the diagram) since reception circuit 32 is in an off-state when reception device 30 is in a low consumption standby mode. Standby circuit 33a responds outputs a wake-up detection signal) to the wake-up signal that is subsequently transmitted. With this, reception device 30 switches from the low consumption standby mode to the data reception mode under the control by control circuit 34.

(c) in FIG. 11 illustrates an example of a signal in the reception performed in step S14 in FIG. 4. The example illustrates a case of stopping transmission (transmission of a wake-up signal and a data transmission frame) when an ACK signal is received (e.g., when normal reception is achieved at the second transmission) (see reference to the data transmission frames and wake-up signals, both of which are indicated by the broken lines in the diagram).

As described above, the communication system according to this variation is a communication system including transmission device 20 and reception device 30 which wirelessly communicate with each other. Transmission device 20 includes transmission circuit 21 that performs (i) transmission of a wake-up signal including a specific pattern and (ii) transmission of data. Reception device 30 includes: standby circuit 33a that receives a signal, and outputs a detection signal indicating reception of the wake-up signal when detecting that the specific pattern is included in the signal received; and reception circuit 32 that receives data from transmission device 20 after the detection signal is output from standby circuit 33a. The specific pattern is a long pulse having radio field intensity that is continuously higher than a first threshold during a time period that is longer than the maximum frame period in data transmission specified in a communication standard. When receiving the long pulse having radio field intensity that is continuously higher than a second threshold during the time, standby circuit 33a outputs the detection signal.

A communication method according to this variation is a communication method for use in communication system 10 including transmission device 20 and reception device 30 which wirelessly communicate with each other. The communication method includes: transmission step S10 of performing, by transmission device 20, (i) cyclical transmission of a wake-up signal including a specific pattern and (ii) transmission of data; standby step S11, which is performed by reception device 30, of receiving a signal, and outputting a detection signal indicating reception of the wake-up signal when detecting that the specific pattern is cyclically included in the signal received; and reception step S12 of receiving, by reception device 30, the data from the transmission device after the detection signal is output in standby step S11.

This achieves the communication system and the communication method that enable standby reception with low power consumption and good accuracy even in a field environment with noise since a wake-up signal detected by standby circuit 33a that operates independently from reception circuit 32 (i.e., operates with low power consumption) is not merely a signal whose level is higher than a noise level, but is a peculiar signal referred to as a long pulse having radio field intensity that is continuously higher than the first threshold during a time period that is longer than the maximum frame period in data transmission specified in a communication standard.

Although the communication system, transmission device, reception device, and communication method according to the present invention have been described based on an embodiment and a variation thereof, the present invention is not limited to the embodiment and variation. Forms obtained by various modifications to the exemplary embodiment that can be conceived by a person of skill in the art as well as forms realized by arbitrarily combining structural components and functions in the exemplary embodiment which are within the scope of the essence of the present disclosure are included in the present disclosure.

Although communication system 10 according to the aforementioned embodiment includes transmission device 20 and reception device 30 which include identical elements, the configuration of communication system 10 is not limited to such. Transmission device 20 may be a device dedicated to transmission and include only transmission circuit 21, and reception device 30 may be a device dedicated to reception and include reception circuit 32 and standby circuit 33. Even the communication system with such a configuration has a feature of transmitting a wake-up signal in which a specific pattern is cyclically included.

Although the aforementioned embodiment describes that reception circuit 32 (reception circuit 22) in a low consumption standby mode does not receive power supply from a power circuit, the state of reception circuit 32 is not limited to such. Reception circuit 32 may be in a state of receiving power supplied from the power circuit but not operating or a state in which the supply of clock signals required for reception circuit 32 to operate is stopped. In either state, reception circuit 32 (reception circuit 22) stops operating in the low consumption standby mode, and the amount of power consumed by reception device 30 (transmission device 20) is low.

In the aforementioned embodiment, a specific pattern included in a wake-up signal is either an on-off modulated signal or a long pulse, but the specific pattern may be a signal that includes both an on-off modulated signal and a long pulse. Moreover, an individual specific pattern is either an on-off modulated signal or a long pulse, but with the elapse of time, the on-off modulated signal may be switched to a long pulse or the long pulse may be switched to an on-off modulated signal. For example, a specific pattern may be switched alternately between an on-off modulated signal and a long pulse at regular time intervals.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present invention can be utilized as communications systems, transmission devices, reception devices, and communication methods, and in particular, as communication devices for performing standby reception with low power consumption and good accuracy even in a field environment with noise, in communications systems including transmission devices and reception devices which wirelessly communicate with each other.

What is claimed is:

1. A communication system comprising a transmission device and a reception device which wirelessly communicate with each other, wherein
the transmission device includes a transmission circuit that performs (i) cyclical transmission of a wake-up signal including a specific pattern (ii) and transmission of data, and
the reception device includes:
a standby circuit that receives the wake-up signal, and outputs a detection signal indicating reception of the wake-up signal when detecting that the specific pattern is cyclically included in the signal received; and
a reception circuit that receives the data from the transmission device after the detection signal is output from the standby circuit, wherein
the transmission circuit repeats the cyclically cyclical transmission of the wake-up signal including the specific pattern at fixed time intervals, and
the specific pattern is a long pulse having radio field intensity that is continuously higher than a first threshold during a time period that is longer than a maximum frame period in data transmission specified in a communication standard.

2. The communication system according to claim 1, wherein the standby circuit repeats, with regularity, a process of determining, within a predetermined period, whether the specific pattern is included in the signal received, and outputs the detection signal when determining, at least a predetermined number of times, that the specific pattern is included in the signal received.

3. The communication system according to claim 2, wherein
the regularity means fixed time intervals.

4. The communication system according to claim 3, wherein
each of the fixed time intervals is n times as long as a cycle in which the transmission circuit cyclically transmits the specific pattern, where n is an integer of 2 or greater.

5. The communication system according to claim 4, wherein
when the predetermined period is divided into a plurality of time slots, the standby circuit outputs the detection signal when determining, at least the predetermined number of times in one of the plurality of time slots, that the specific pattern is included in the signal received.

6. The communication system according to claim 1, wherein
the specific pattern is an on-off modulated signal.

7. The communication system according to claim 1, wherein
the specific pattern includes a modulated signal obtained by modulating arbitrary data.

8. The communication system according to claim 1, wherein
the transmission circuit transmits the data and subsequently transmits the wake-up signal.

9. A communication system comprising a transmission device and a reception device which wirelessly communicate with each other, wherein
the transmission device includes a transmission circuit that performs (i) transmission of a wake-up signal including a specific pattern (ii) and transmission of data,
the reception device includes:
a standby circuit that receives a signal, and outputs a detection signal indicating reception of the wake-up signal when detecting that the specific pattern is included in the signal received; and
a reception circuit that receives the data from the transmission device after the detection signal is output from the standby circuit,
the specific pattern is a long pulse having radio field intensity that is continuously higher than a first threshold during a time period that is longer than a maximum frame period in data transmission specified in a communication standard, and
when receiving the long pulse having radio field intensity that is continuously higher than a second threshold during the time period, the standby circuit outputs the detection signal.

10. A transmission device in a communication system including the transmission device and a reception device which wirelessly communicate with each other, the transmission device comprising:
a transmission circuit that performs (i) cyclical transmission of a wake-up signal including a specific pattern (ii) and transmission of data, wherein
the reception device includes:
a standby circuit that receives the wake-up signal, and outputs a detection signal indicating reception of the wake-up signal when detecting that the specific pattern is cyclically included in the signal received; and
a reception circuit that receives the data from the transmission device after the detection signal is output from the standby circuit, wherein
the transmission circuit repeats the cyclical transmission of the wake-up signal including the specific pattern at fixed time intervals, and
the specific pattern is a long pulse having radio field intensity that is continuously higher than a first threshold during a time period that is longer than a maximum frame period in data transmission specified in a communication standard.

11. A reception device in a communication system including a transmission device and the reception device which wirelessly communicate with each other, the reception device comprising:
a standby circuit that receives the wake-up signal, and outputs a detection signal indicating reception of the wake-up signal when detecting that the specific pattern is cyclically included in the signal received; and
a reception circuit that receives the data from the transmission device after the detection signal is output from the standby circuit, wherein
the transmission device includes a transmission circuit that performs (i) cyclical transmission of a wake-up signal including a specific pattern (ii) and transmission of data, wherein
the transmission circuit repeats the cyclical transmission of the wake-up signal including the specific pattern at fixed time intervals, and
the specific pattern is a long pulse having radio field intensity that is continuously higher than a first threshold during a time period that is longer than a maximum frame period in data transmission specified in a communication standard.

12. A transmission device in a communication system including the transmission device and a reception device which wirelessly communicate with each other, the transmission device comprising:
a transmission circuit that performs (i) transmission of a wake-up signal including a specific pattern (ii) and transmission of data, wherein
the reception device includes:
a standby circuit that receives a signal, and outputs a detection signal indicating reception of the wake-up signal when detecting that the specific pattern is included in the signal received; and
a reception circuit that receives the data from the transmission device after the detection signal is output from the standby circuit,
the specific pattern is a long pulse having radio field intensity that is continuously higher than a first threshold during a time period that is longer than a maximum frame period in data transmission specified in a communication standard, and
when receiving the long pulse having radio field intensity that is continuously higher than a second threshold during the time period, the standby circuit outputs the detection signal.

13. A reception device in a communication system including a transmission device and the reception device which wirelessly communicate with each other, the reception device comprising:

a standby circuit that receives a signal, and outputs a detection signal indicating reception of the wake-up signal when detecting that the specific pattern is included in the signal received; and a reception circuit that receives the data from the transmission device after the detection signal is output from the standby circuit, wherein the transmission device includes a transmission circuit that performs (i) transmission of a wake-up signal including a specific pattern (ii) and transmission of data, the specific pattern is a long pulse having radio field intensity that is continuously higher than a first threshold during a time period that is longer than a maximum frame period in data transmission specified in a communication standard, and when receiving the long pulse having radio field intensity that is continuously higher than a second threshold during the time period, the standby circuit outputs the detection signal.

14. A communication method for use in a communication system including a transmission device and a reception device which wirelessly communicate with each other, the communication method comprising:

performing, by the transmission device, (i) cyclical transmission of a wake-up signal including a specific pattern (ii) and transmission of data;

by the reception device, receiving the wake-up signal, and outputting a detection signal indicating reception of the wake-up signal when detecting that the specific pattern is cyclically included in the signal received; and receiving, by the reception device, the data from the transmission device after the detection signal is output in the receiving of the signal and the outputting of the detection signal, wherein the transmission device repeats the cyclical transmission of the wake-up signal including the specific pattern at fixed time intervals, and the specific pattern is a long pulse having radio field intensity that is continuously higher than a first threshold during a time period that is longer than a maximum frame period in data transmission specified in a communication standard.

15. A communication method for use in a communication system including a transmission device and a reception device which wirelessly communicate with each other, the communication method comprising:

performing, by the transmission device, (i) transmission of a wake-up signal including a specific pattern and (ii) transmission of data;

by the reception device, receiving a signal, and outputting a detection signal indicating reception of the wake-up signal when detecting that the specific pattern is included in the signal received; and receiving, by the reception device, the data from the transmission device after the detection signal is output in the receiving of the signal and the outputting of the detection signal, wherein the specific pattern is a long pulse having radio field intensity that is continuously higher than a first threshold during a time period that is longer than a maximum frame period in data transmission specified in a communication standard, and in the receiving of the signal and the outputting of the detection signal, the detection signal is output when the long pulse is received, the long pulse having radio field intensity that is continuously higher than a second threshold during the time period.

* * * * *